(12) United States Patent
Balakrishnan

(10) Patent No.: US 7,170,756 B2
(45) Date of Patent: *Jan. 30, 2007

(54) TRIMMING ELECTRICAL PARAMETERS IN A POWER SUPPLY SWITCHING REGULATOR ELECTRICAL CIRCUIT

(75) Inventor: Balu Balakrishnan, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 164 days.

This patent is subject to a terminal disclaimer.

(21) Appl. No.: 10/655,318

(22) Filed: Sep. 4, 2003

(65) Prior Publication Data

US 2004/0045160 A1    Mar. 11, 2004

Related U.S. Application Data

(63) Continuation of application No. 09/789,370, filed on Feb. 20, 2001, now Pat. No. 6,640,435.

(51) Int. Cl.
*H05K 7/02* (2006.01)
*H05K 7/06* (2006.01)
*H05K 7/08* (2006.01)
*H05K 7/10* (2006.01)

(52) U.S. Cl. ............... 361/777; 361/760; 361/781; 29/847

(58) Field of Classification Search ........ 361/760–761; 29/846–849
See application file for complete search history.

(56) References Cited

U.S. PATENT DOCUMENTS

| | | | |
|---|---|---|---|
| 3,638,162 A | 1/1972 | McWade | |
| 4,592,606 A | 6/1986 | Mudra | |
| 4,823,070 A | 4/1989 | Nelson | |
| 4,933,829 A | 6/1990 | White | |
| 4,985,808 A | 1/1991 | Zernov | |
| 5,112,230 A | 5/1992 | DeSimone | |
| 5,359,168 A | 10/1994 | Cunningham | |
| 5,471,368 A * | 11/1995 | Downie et al. | ............. 361/760 |
| 5,502,885 A | 4/1996 | Hanamura et al. | |
| 5,765,280 A | 6/1998 | Joshi | |
| 5,990,752 A | 11/1999 | Papazian et al. | |
| 6,005,773 A | 12/1999 | Rozman et al. | |
| 6,161,276 A | 12/2000 | Droz | |
| 6,308,406 B1 * | 10/2001 | Gill et al. | ..................... 29/849 |

FOREIGN PATENT DOCUMENTS

| | | |
|---|---|---|
| EP | 0254965 A1 | 2/1988 |
| EP | 0817150 A1 | 1/1998 |
| EP | 0852423 | 7/1998 |
| EP | 1045626 A1 | 10/2000 |
| EP | 02250988 | 3/2004 |
| EP | 02250988 | 7/2004 |

\* cited by examiner

*Primary Examiner*—Tuan Dinh
(74) *Attorney, Agent, or Firm*—Blakely, Sokoloff, Taylor & Zafman, LLP

(57) ABSTRACT

Electrical circuit trimming methods. In one aspect of the invention, a trimming method includes assembling one or more components of an electrical circuit onto a printed circuit board having one or more electrical connections coupled to the said one or more components. An electrical parameter of the electrical circuit is then trimmed. The trimming of the electrical parameter of the electrical circuit includes removing a portion of the printed circuit board to break the electrical connection on the printed circuit board. In another aspect of the invention, the trimming the electrical parameter of the electrical circuit includes electrical programming of the electrical circuit.

14 Claims, 7 Drawing Sheets

TRIMMING ELECTRICAL PARAMETERS IN A POWER SUPPLY SWITCHING REGULATOR ELECTRICAL CIRCUIT

This is a Continuation of U.S. application Ser. No. 09/789,370, filed Feb. 20, 2001, now U.S. Pat. No. 6,640,435.

BACKGROUND OF THE INVENTION

1. Field of the Invention

The present invention relates generally to electrical circuits and, more specifically, the present invention relates to electrical circuit trimming.

2. Background Information

In electrical circuit manufacture, it is often desirable to trim the circuit operation after the circuit is assembled in order to compensate for manufacturing tolerances. Known techniques to achieve trimming of electrical parameters at final assembly include the use of trimming potentiometers which add circuitry, are prone to instability (under mechanical/thermal stress) and also require human interaction to provide the adjustment. Other techniques include the use of wire links (jumpers) or resistors assembled onto the printed circuit board and subsequently disconnected (or clipped) to trim circuit parameters. These techniques add cost and complexity since they often require human interaction to provide the trim and add components to the electrical circuit.

Known power supplies employ sensing of the output voltage and or current of the power supply to provide a feedback signal. The feedback signal is then used by a switching regulator to accurately control the output characteristic. Typically, such power supplies employ direct output voltage and current sensing. Other configurations employ an indirect sensing of the output, often using the windings of the transformer to derive information about the output. The indirect sensing techniques are sometimes attractive as they eliminate some circuitry. However, indirect sensing techniques typically suffer from poorer voltage and current regulation accuracy since the feedback information is influenced by other factors such as transformer manufacturing tolerances, which are difficult and expensive to improve.

SUMMARY OF THE INVENTION

Electrical circuit trimming methods are disclosed. In one aspect of the invention, a trimming method includes assembling one or more components of an electrical circuit onto a printed circuit board having one or more electrical connections coupled to the said one or more components. An electrical parameter of the electrical circuit is then trimmed. The trimming of the electrical parameter of the electrical circuit includes removing a portion of the printed circuit board to break the electrical connection on the printed circuit board. Additional features and benefits of the present invention will become apparent from the detailed description, figures and claims set forth below.

BRIEF DESCRIPTION OF THE DRAWINGS

The present invention detailed illustrated by way of example and not limitation in the accompanying figures.

DETAILED DESCRIPTION

Figure 1:
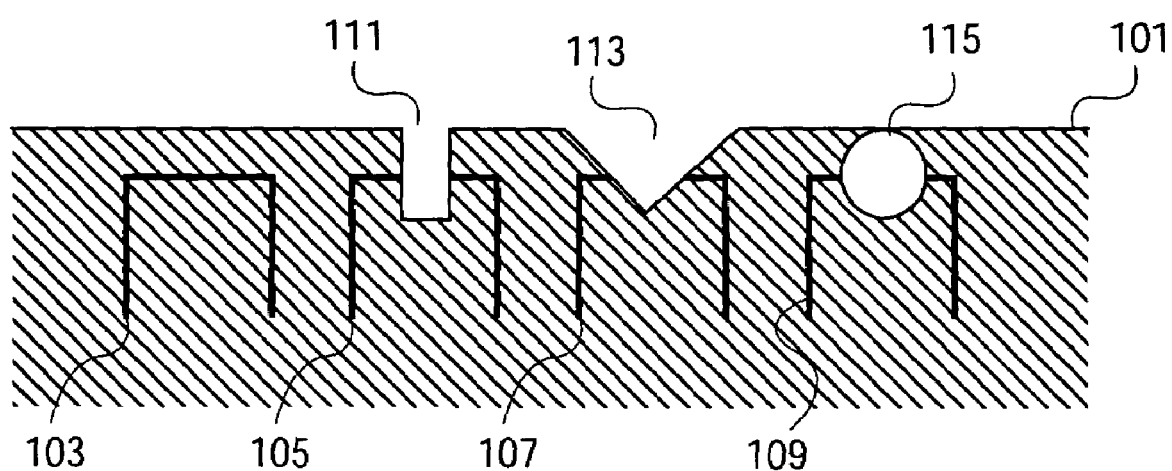
FIG. 1 is a diagram illustrating one embodiment of the use of a slot, nibble or punched hole to break a metal printed circuit board trace in accordance with the teachings of the present invention.

Embodiments of methods and apparatuses for trimming an electrical circuit such as a power supply regulator are disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

As an overview, embodiments of the present invention introduce several techniques to provide automated trimming capability in an assembled electrical circuit without adding any additional components. As such, electrical circuit parameters are trimmed in accordance with the teachings of the present invention without adding cost to the circuit manufacture. In one embodiment, this allows the output characteristic of a switching power supply to be adjusted by trimming specific parameters of the switching regulator after the power supply circuit has been assembled. This technique can be used to compensate for manufacturing tolerances in order to set the power supply output characteristic accurately without the need to directly sense the output. The parameters trimmed allow easy control of output current and voltage characteristics.

As will be discussed, trimming can be achieved by either mechanical or electrical techniques in accordance with the teachings of the present invention. For instance, mechanical trimming can be achieved by cutting metal traces on a printed circuit board by for example sawing, nibbling or punching the printed circuit board. Electrical trimming can be achieved by for example applying a specific voltage and current combination to trim a parameter in the electrical circuit using standard programming techniques such as zener zapping (anti-fuse) or metal zapping (fuse).

For explanation purposes, it is noted that specific embodiments for trimming a power supply regulator or a switching power supply are described in detail herewith to adjust electrical parameters such as for example the output voltage and or current of a switching power supply. However, it is appreciated that the novel trimming techniques described herewith may also apply to other electrical circuit technologies in accordance with the teachings of the present invention.

In one embodiment, trimming of a power supply circuit is performed after the complete power supply circuit has been assembled. As a result, manufacturing tolerances of all circuit components can be compensated for after assembly by trimming one or more electrical parameters. The output characteristic can therefore be measured before any trimming is carried out. Once the output characteristic is known, a trimming strategy can be determined to provide the correct degree of adjustment in order to bring the output voltage or current within tighter limits.

Embodiments of the present invention enable maintaining an accurate power supply output characteristic without the need for direct sensing of the output. Accordingly, one embodiment of the present invention provides a technique to trim the switching regulator such that indirect sensing of the output voltage and current can be employed while maintaining the accuracy more normally associated with direct sensing techniques. When using this type of indirect sensing, power supplies are influenced by the manufacturing tolerance of other circuit components such as the transformer and achieving tight tolerances in the output current and voltage is not usually possible. In one embodiment, improved output voltage or current accuracy is realized by trimming the switching regulator after the power supply has been assembled. The trimming can be used to adjust either the output voltage or current.

In sum, embodiments of the present invention introduce several novel techniques to achieve circuit trimming after the final power supply circuit assembly is complete. This allows the power supply circuit to be tested in its final form and trimming to be performed in response to the actual output characteristics of a specific power supply circuit.

Figure 2:
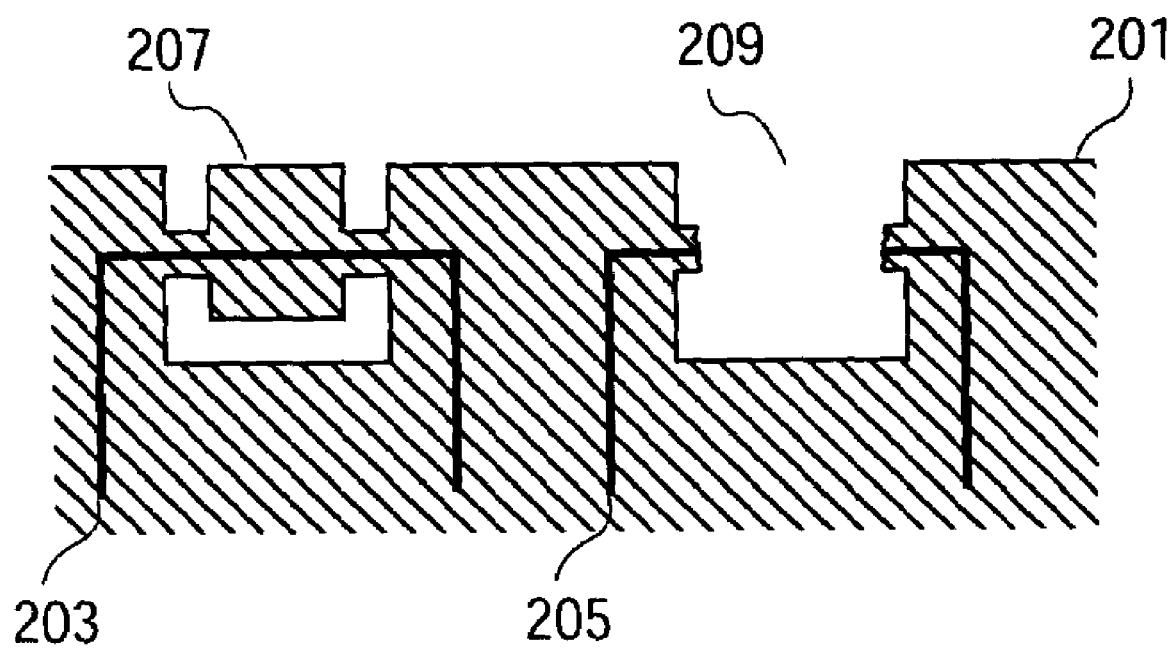
FIG. 2 is a diagram illustrating one embodiment of the breaking off of a piece of a printed circuit board in order to break a metal printed circuit board trace in accordance with the teachings of the present invention.
Figure 3:
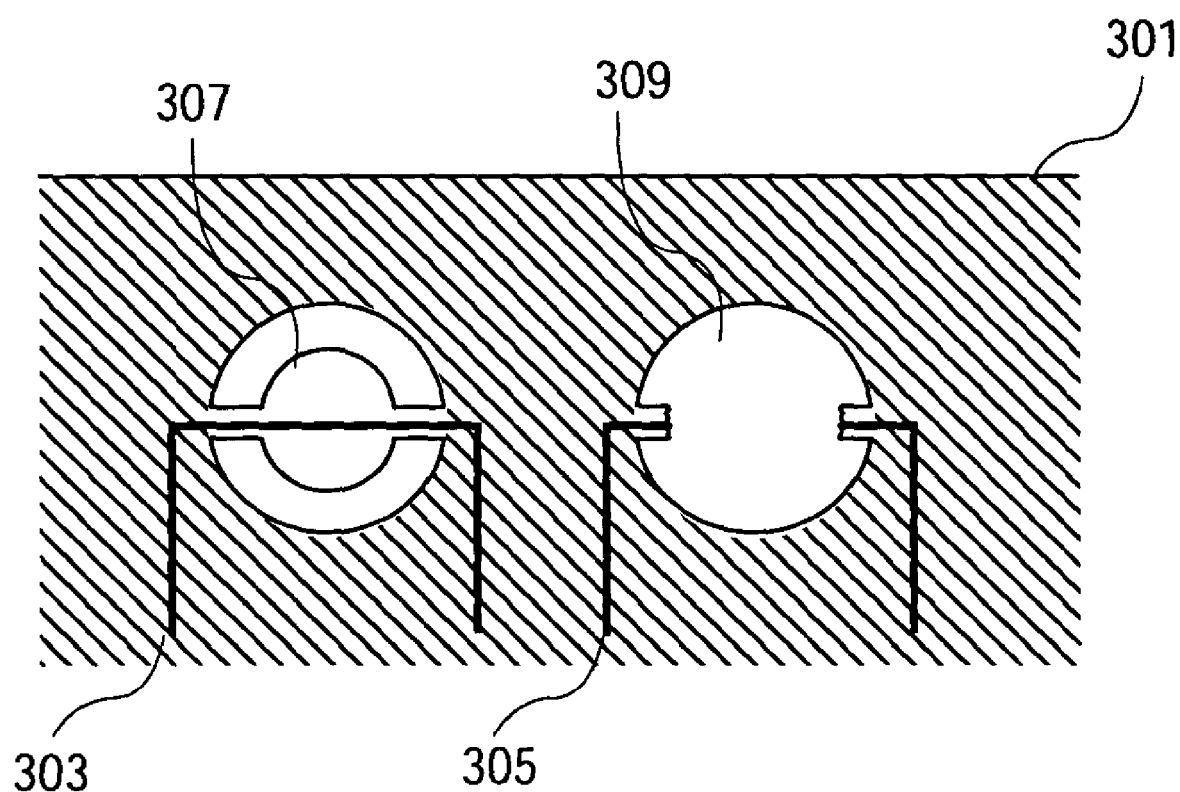
FIG. 3 is a diagram illustrating one embodiment of the use a punch to remove a section of the printed circuit board to break a metal printed circuit board trace in accordance with the teachings of the present invention.

To illustrate, FIGS. 1 to 3 show several embodiments of the invention where mechanical trimming is employed. As shown in FIG. 1, a printed circuit board 101 is illustrated including traces 103, 105, 107 and 109. Trace 103 is an unbroken trace. Trace 105 is broken at a broken trace slot 111 in printed circuit board 101. In one embodiment, broken trace slot 111 is formed by cutting, sawing, etc. from the edge of printed circuit board 101. Trace 107 is broken at nibble location 113 in printed circuit board 101. As shown, the printed circuit board 101 has been nibbled at the edge of the printed circuit 101 at nibble location 113. Trace 109 is broken at a broken trace punched hole 115 in printed circuit board 101.

FIG. 2 shows an example embodiment of breaking off a piece of a printed circuit board in order to break a trace on the printed circuit board in accordance with the teachings of the present invention. In particular, FIG. 2 shows printed circuit board 201 including traces 203 and 205. As shown in the depicted embodiment, printed circuit board 201 includes a breakable section 207 including a portion of trace 203 that is designed to be broken off to break trace 203. As shown, a breakable section of printed circuit 201 including a portion of trace 205 has been broken off at location 209 to break trace 205.

FIG. 3 shows an example embodiment of punching a hole a printed circuit board in order to break a trace on the printed circuit board in accordance with the teachings of the present invention. In particular, FIG. 3 shows printed circuit board 301 including traces 303 and 305. As shown in the depicted embodiment, printed circuit board 301 includes a breakable hole section 307 including a portion of trace 303 that is designed to be broken off to break trace 303. As shown, a breakable hole section of printed circuit 301 including a portion of trace 305 has been broken off at location 309 to break trace 305.

Figure 4:
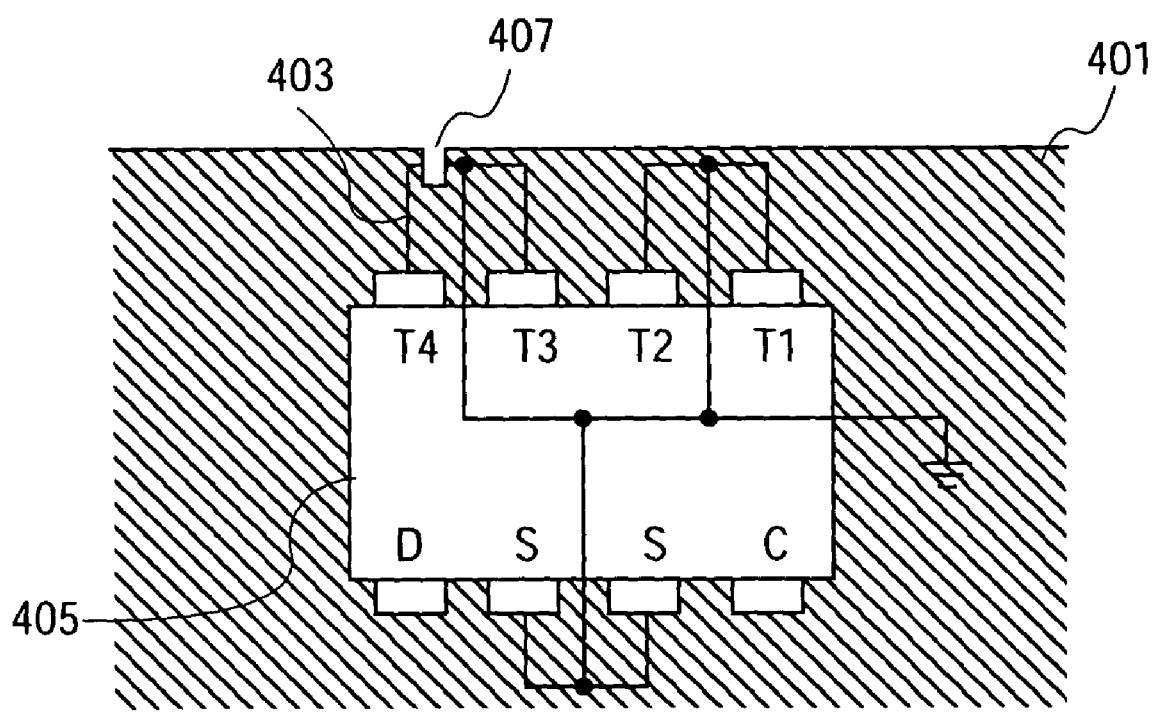
FIG. 4 is a diagram illustrating one embodiment with an electrical circuit having a plurality of trim pins in accordance with the teachings of the present invention.

FIG. 4 below shows one embodiment of a trimming technique in accordance with the teachings of the present invention in a layout of a power supply switching regulator electrical circuit with one or more trim pins. In particular, FIG. 4 shows a printed circuit board 401 including traces 403 and an electrical circuit chip 405 mounted or assembled on the printed circuit board. In one embodiment, traces 403 are metal traces or include other suitable electrically conductive materials and electrical circuit chip 405 is power supply regulator chip. As shown in the depicted embodiment, traces 403 are routed to the edge of the printed circuit board 401 from electrical circuit trim terminals T1, T2, T3 and T4 of chip 405. This allows a slot 407 or the like to be cut in the edge of printed circuit board 401 to break traces 403 as necessary during the trimming process. In the example embodiment shown in FIG. 4, the trim terminals T1, T2, T3 and T4 are coupled to one or more source terminals S coupled to for example a ground voltage unless the printed circuit board is cut, broken, nibbled or the like to break trace 403. In one embodiment, electrical parameters of chip 405 are trimmed after chip 405 is mounted or assembled on printed circuit board 401 and the circuit is assembled by breaking trace 403 as desired to break the connection from the desired trim terminals T1, T2, T3 and/or T4 to ground. Accordingly, trimming can be performed in discrete increments in accordance with the teachings of the present invention in response to which trim terminals T1, T2, T3 and/or T4 are disconnected from ground.

Figure 5:
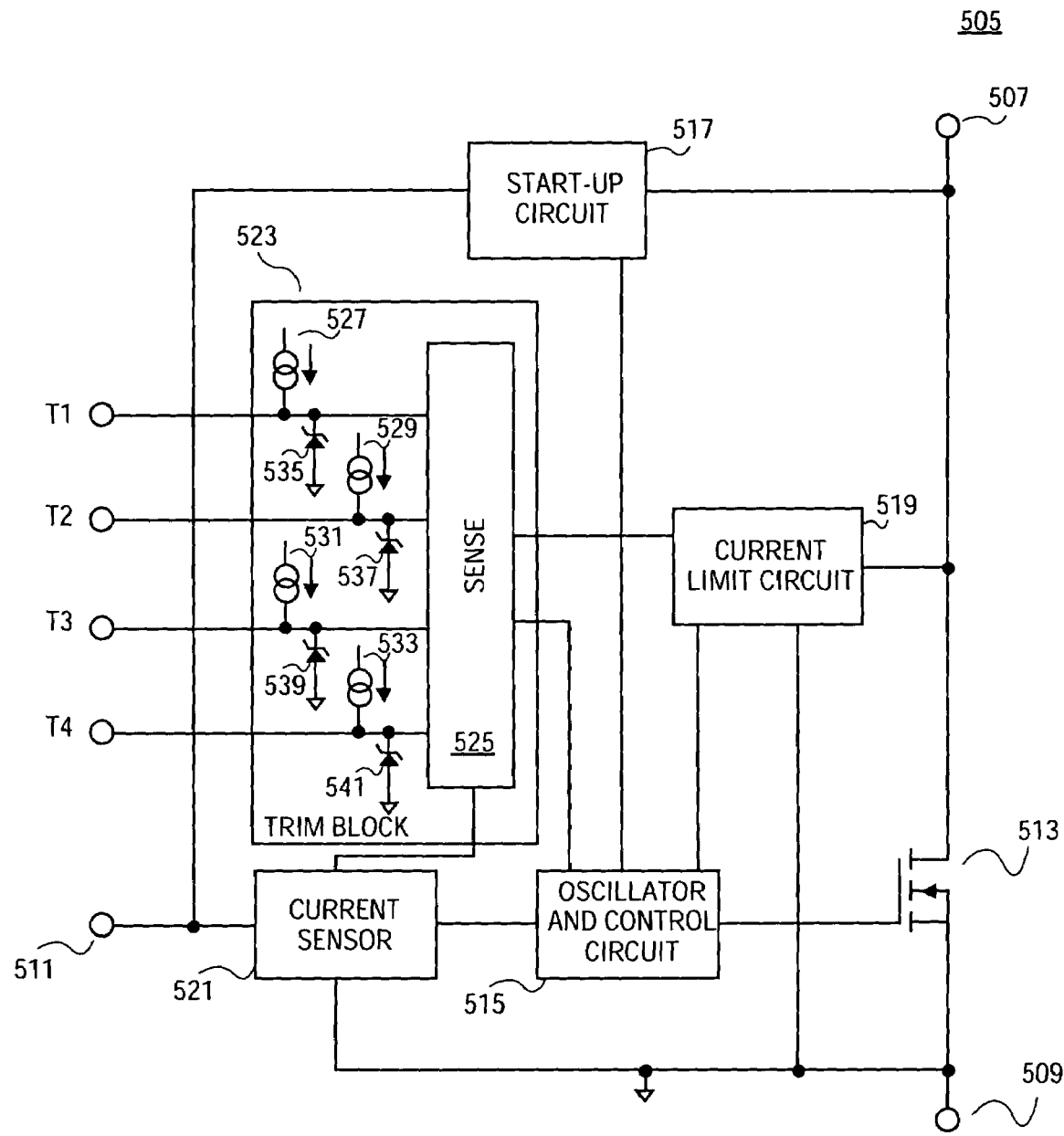
FIG. 5 is a block diagram illustrating one embodiment of a power supply regulator in accordance with the teachings of the present invention.

FIG. 5 shows a block diagram of one embodiment of a switching regulator or power supply regulator 505 that employs a trimming technique in accordance with the teachings of the present invention. In one embodiment, power supply regulator 505 is fabricated as a monolithic chip. As shown, power supply regulator includes a power switch 513 coupled between a drain terminal 507 and a source terminal 509. Power switch 513 is controlled by an oscillator and control circuit 515. In one embodiment, a start-up circuit 517 is coupled to a drain terminal 507, a control input terminal 511 and oscillator and control circuit 515. In one embodiment, a current limit circuit is coupled to the oscillator and control circuit 515 and across the power switch 513 between the drain terminal 507 and source terminal 509. In one embodiment, a current sensor is coupled to the control input terminal 511, source terminal 509 and oscillator and control circuit 515.

As illustrated in FIG. 5, power supply regulator 505 includes a power switch 513 coupled between electrical terminals 507 and 509. In one embodiment, power switch 513 comprises a metal oxide semiconductor field effect transistor (MOSFET). In one embodiment, power switch 513 comprises an n-channel MOSFET having a drain coupled to terminal 507 and a source coupled to terminal 509. In one embodiment, terminal 507 is configured to be coupled to a positive input supply rail and terminal 509 is configured to be coupled to an energy transfer element of a power supply.

As shown in the embodiment depicted, power supply regulator 505 also includes a current sensor 521 coupled to receive a current through control input terminal 511. In one embodiment, the current received through the control input terminal 511 is responsive to a reflected voltage from a energy transfer element of a power supply that power supply regulator 505 is coupled to regulate. In one embodiment, power switch 513 is switched in response to the current received through the control input terminal 511. In addition, current sensor 521 provides in one embodiment a low impedance connection between control input terminal 511 and terminal 509. A control circuit 515 is coupled to current sensor 521 and power switch 513 in one embodiment. As such, control circuit 515 is coupled to control the switching of power switch 513 responsive to the current coupled to be received through control input terminal 511.

In one embodiment, oscillator and control circuit 515 includes a voltage mode or a current mode pulse width modulator (PWM) regulator or the like to control the switching of power switch 513. In another embodiment, control circuit 515 includes an on/off control circuit, or a variable frequency circuit, or a cycle skipping circuit, or the like to control the switching of power switch 513.

In one embodiment, current limit circuit 519 monitors the current that flows through power switch 513 when turned on by monitoring the drain to source voltage of power switch 513. In one embodiment, the on resistance of power switch 513 is used as a current sense resistor. In one embodiment, when the current that flows through power switch 513 reaches a current limit, oscillator and control circuit 515 adjusts the switching of power switch 513 accordingly such that that the current that flows through power switch 513 does not exceed the current limit.

In one embodiment, the current limit of the power switch 513 determined by current limit circuit 519 is adjusted in response to a current representative of the reflected voltage received through control input terminal 511 as sensed by current sensor 521. For example, in one embodiment, the current limit is adjusted from a lower value during start up of the power supply to a higher value at a regulation current threshold.

In one embodiment, a bias current used to power the circuitry of power supply regulator 505 after start-up is also coupled to be received through control input terminal 511. In one embodiment, a capacitor is configured to be coupled between control input terminal 511 and source terminal 509. In one embodiment, the capacitor configured to be coupled between control input terminal 511 and source terminal 509 is charged with a current during start-up with start-up circuit 517.

As shown in the embodiment of FIG. 5, the power supply regulator 505 also includes one or more trim terminals, such as for example T1, T2, T3 and T4, coupled internally to a trim block 523. In one embodiment, trim block 523 includes sense circuitry 525 coupled to the trim terminals T1, T2, T3 and T4 and current limit circuit 519, oscillator and control circuit 515 and current sensor 521. In one embodiment, sense circuitry 525 includes circuitry to sense an impedance from each respective trim terminal T1, T2, T3 and/or T4 to a voltage such as for example ground.

In one embodiment, trim block 523 is used internally to adjust one or more electrical parameters of power supply regulator 505 in response to sensed impedances from trim terminals T1, T2, T3 and/or T4. As shown in FIG. 5, one embodiment of sense circuitry of sense circuitry 525 is coupled to current limit circuit 519, oscillator and control circuit 515 and current sensor 521 to trim electrical parameters associated with current limit circuit 519, oscillator and/or control circuit 515 and current sensor 521 in accordance with the teachings of the present invention. For example, in one embodiment, trim block 523 is used to trim one or more of the regulation current thresholds associated with the control input terminal 511, the current limit in the current limit circuit 519 and/or the frequency in the oscillator and control circuit 515. In one embodiment, trim block 523 is designed to trim one or more electrical parameters using the mechanical trimming techniques such as for example those described above by breaking traces on a printed circuit board on which power supply regulator 505. In one embodiment, the traces may be broken after assembly of the power supply is complete.

In another embodiment, or electrical trimming techniques may be employed to trim power supply regulator 505. In one embodiment, electrical parameters are trimmed by programming for example fuses, anti-fuses or the like included in power supply regulator 505. To illustrate, in an example embodiment in which power supply regulator 505 is trimmed electrically instead of mechanically, trimming is achieved by using zener zapping. In such an embodiment, power supply regulator 505 includes for example includes a respective current source and a respective zener diode coupled to each trim terminal. For example, as depicted in the embodiment of FIG. 5, current source 527 and zener diode 535 are coupled to trim terminal T1, current source 529 and zener diode 537 are coupled to trim terminal T2, current source 531 and zener diode 539 are coupled to trim terminal T3 and current source 533 and zener diode 541 are coupled to trim terminal T4.

In one embodiment employing electrical trimming in accordance with the teachings of the present invention, the zener diodes such as for example zener diodes 535, 537, 539 and/or 541 prior to zapping or programming exhibit a high impedance to circuit common or ground and are therefore the equivalent of an open circuit in the mechanical schemes discussed above. In one embodiment, and internal current sources such as for example current sources 527, 529, 531 and/or 533 are coupled to the respective cathode of zener diodes 535, 537, 539 or 541 to provide a pull up to provide reliable sensing of the zener voltage prior to zapping or programming.

When a zener diode 535, 537, 539 and/or 541 is correctly zapped, it exhibits low impedance to circuit common (source terminal 509) and is therefore the equivalent of a short circuit to circuit common (source terminal 509) in the mechanical schemes discussed above. In one embodiment, the zapping itself is performed according to the characteristics of the zener diodes 535, 537, 539 and/or 541. In one embodiment, the internal zener voltage is exceeded with a fixed current applied to the corresponding trim terminal T1, T2, T3 or T4 for a specified period sufficient to zap the corresponding zener diode 535, 537, 539 or 541. In another embodiment, an external capacitor (not shown) of known value is charged to a known voltage to provide a known energy source. When applied to corresponding the trim terminal T1, T2, T3 or T4, the corresponding internal zener diode 535, 537, 539 or 541 is zapped as the external capacitor discharges, dissipating its stored energy in the respective zener diode 535, 537, 539 or 541.

Figure 6:
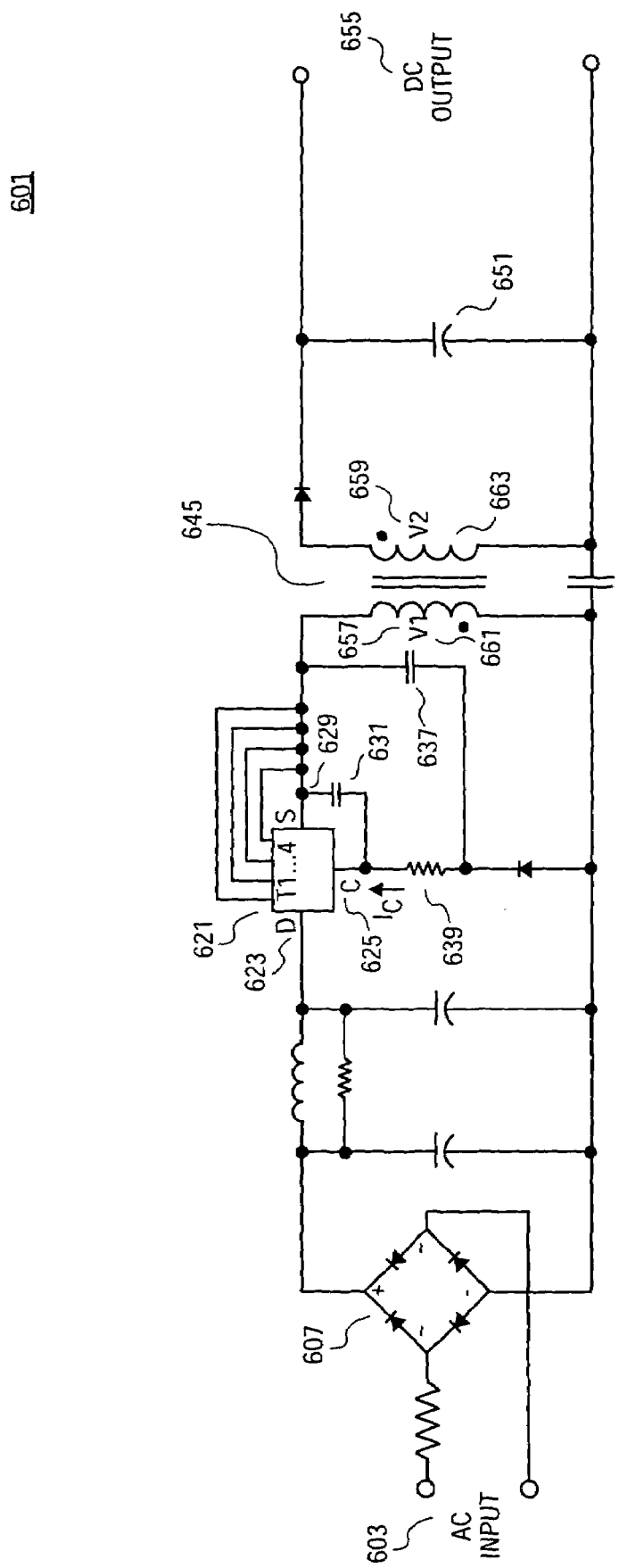
FIG. 6 is a schematic illustrating one embodiment of a power supply circuit including one embodiment of a power supply regulator in accordance with the teachings of the present invention.

FIG. 6 is a schematic of one embodiment of a power supply 601 in accordance with the teachings of the present invention. Power supply 601 includes a power supply regulator 621 similar to power supply regulator 505 described in FIG. 5. A shown in the embodiment of FIG. 5, power supply regulator 621 includes one or more trim terminals T1 ... 4, a drain terminal 623, a source terminal 629 and a control input terminal 625. In one embodiment, operation of these terminals is similar to that described in connection with the corresponding terminals in FIG. 5. In one embodiment, the "external capacitor" discussed in connection with FIG. 5 may correspond to capacitor 631 of FIG. 6 coupled between terminals 625 and 629 for start up energy storage and supply bypassing. In one embodiment, capacitor 631 also provides control loop compensation for power supply 601. In another embodiment, the bias current used to power the circuitry of power supply regulator 621 may be derived from drain terminal 623. In this embodiment, a capacitor may be coupled between a separate bias supply electrical terminal (not shown) and source terminal 629 for energy storage and high frequency bypassing.

Operation of an embodiment of power supply 601 employing a power supply regulator similar to power supply regulator 505 of FIG. 5 for power supply regulator 621 in FIG. 6 is as follows. Assume for this illustration that terminals 623, 625 and 629 of power supply regulator 621 correspond to terminals 507, 511 and 509, respectively, of power supply regulator 505. In one embodiment, an alternating current (AC) voltage is applied to AC input 603. In one embodiment, the AC voltage that is applied to AC input 603 is 85 to 265 volts. Rectifier circuit receives the AC voltage and applies that rectified voltage to a primary winding 661 of an energy transfer element 645 and a drain terminal 623 of a power supply regulator 621. A regulated direct current (DC) voltage is generated at DC output 655.

Referring to both FIGS. 5 and 6, at power-up or a beginning of a start-up period of power supply 601, start-up circuit 517 in one embodiment is coupled to provide a current between terminal 623 and control input terminal 625 to charge capacitor 631 to an adequate voltage to provide the bias current used to supply power to power supply regulator 621 for the duration of the start-up condition. In one embodiment, a current source (not shown) included within start-up circuit 517 is activated to draw current from terminal 623 to charge capacitor 631 through control input terminal 625. After capacitor 631 is sufficiently charged, the current source in start-up circuit 517 is deactivated. When the sufficient voltage is reached in capacitor 631, the energy stored in capacitor 631 is used in one embodiment to operate power supply regulator 621 long enough to complete the start-up of power supply 601.

In another embodiment, an additional terminal (not shown) may be included for connection to a start-up energy storage capacitor, such as for example capacitor 631. Alternatively, in this embodiment, the bias current used to power the power supply regulator 621 may be derived from terminal 623 both during start-up and during normal operation after start-up. In either case, the capacitor coupled to the additional terminal can also perform the function of high frequency bypassing.

During start-up of power supply 601, the current received through control input terminal 625 representative of the reflected voltage V1 657 from primary winding 661 of energy transfer element 645 is substantially zero. The reflected voltage V1 657 is the voltage across the primary winding when the power switch 531 is off and the energy is being delivered to the output. At this time, one embodiment of current limit circuit 519 and oscillator and control circuit 515 are coupled to switch power switch 513 such that a limited amount of power is delivered to secondary winding 663 of energy transfer element 645 to charge output capacitor 651, resulting in reflected voltage V1 657 eventually being large enough to charge capacitor 637 to drive current through resistor 639 into control input terminal 625.

In one embodiment, after start-up, the current driven through resistor 639 is also used to supply the bias current used to supply power to power supply regulator 621. In one embodiment, the current driven through resistor 639 to supply the bias current also includes current resulting from the inductive leakage voltage spikes that occur across primary winding 661 when power switch 513 is switched off. It is appreciated that known switched mode power supplies often simply dissipate the energy caused by leakage inductance. Thus, power supply 601 has increased efficiency over known switched mode power supplies because a part of the energy from the leakage inductance is utilized to supply power to power supply regulator 621. In addition, a separate bias winding on the energy transfer element 645 is not needed to provide the bias supply current, as is sometimes the case in known switched mode power supplies. Thus, power supply 601 operates with fewer components than known switched mode power supplies, which reduces cost.

In one embodiment, as the current representative of the reflected voltage V1 657 driven through resistor 639 into control input terminal 625 increases, power supply regulator 621 is coupled to increase the power level delivered to DC output 655 such that a substantially constant output current is delivered by DC output 655, which is substantially independent of the output voltage across DC output 655. In one embodiment, the power level delivered to the DC output 655 is changed by changing the current limit determined by current limit circuit 519 of power switch 513 from a lower value at start-up as a function of the current through resistor 639 to a higher value at the regulation current threshold.

In one embodiment, when the current representative of the reflected voltage V1 657 driven through resistor 639 reaches the regulation current threshold, power supply regulator 621 reduces the power delivered by power switch 513 such that reflected voltage V1 657 is maintained very close to this level, which drives current approximately equal to the regulation current threshold through resistor 639. Accordingly, the output voltage V2 659 is maintained at a voltage related to reflected voltage V1 657 based on the turns ratio of energy transfer element 645, the regulation current threshold value and the value of resistor 639.

It is noted that power supply 601 of FIG. 6 is illustrated with physical trim connections between terminals T1, T2, T3 and T4 and source terminal 629 to enable the mechanical trimming techniques discussed above. In another embodiment, however, the power supply regulator 621 can be designed to also accept electrical trims through the pins T1, T2, T3 and T4 as discussed above.

Figure 7:
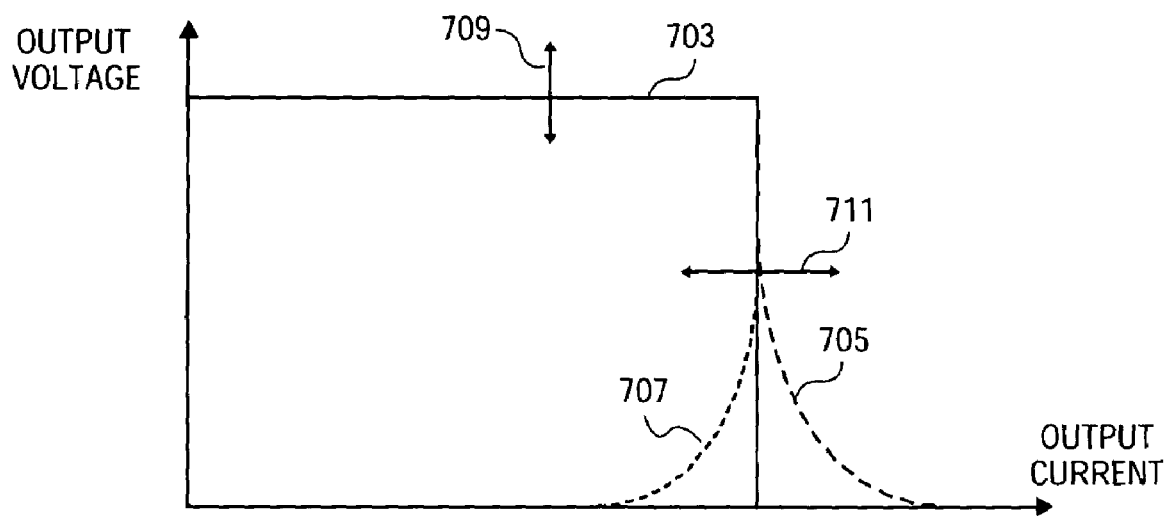
FIG. 7 is a diagram illustrating one embodiment of output characteristic adjustment with various trim options in accordance with the teachings of the present invention.

FIG. 7 is a diagram 701 illustrating the relationships of output current and output voltage of several embodiments of a power supply in accordance with the teachings of the present invention. As illustrated in curve 703 of FIG. 7, one embodiment of a power supply in accordance with the teachings of the present invention exhibits a substantially constant output current/constant output voltage characteristics. That is, as output loading increases, output voltage remains substantially constant until the output current reaches an output current threshold. As the output loading is increased further, the output voltage decreases as the output current remains substantially constant over the drop in output voltage. It is appreciated that the constant output voltage/constant output current characteristics of one embodiment of the present invention are suitable for battery charger applications or the like.

In one embodiment, the output current and output voltage relationship can be adjusted by trimming the power supply regulator in accordance with the teachings of the present invention. In one embodiment, trimming control input terminal current sense of the power supply regulator adjusts the output voltage, as indicated with reference numeral 709. In one embodiment, trimming either the oscillator frequency or the drain current limit of the power supply regulator adjusts the output current, as indicated with reference numeral 711.

In one embodiment, curve 705 shows that one embodiment of a power supply in accordance with the teachings of the present invention has a substantially constant voltage/constant current characteristic except that below a certain voltage level the current increases. In yet another embodiment, curve 707 shows that another embodiment of a power supply in accordance with the teachings of the present invention has a substantially constant voltage/constant current characteristic except that below a certain voltage level the current decreases. In one embodiment, control circuit 515 in FIG. 5 provides constant output voltage control by reducing the duty cycle of power switch 513 when current sensor 521 senses that the current received at control input terminal 511 has reached the regulation current threshold. In one embodiment, substantially accurate regulation is provided by power supply regulator 505 by control circuit 515 causing relatively large duty cycle changes in power switch 513 for relatively slight changes in current sensed by current sensor 521 above the regulation current threshold. As a result, the current received through control input terminal 511 remains substantially constant near the regulation current threshold in one embodiment of the present invention.

In one embodiment, the constant output voltage value of curve 703 in FIG. 7 is determined by the value of resistor 639 and the turns ratio of the transformer of energy transfer element 645 in FIG. 6 for a given regulation current threshold current value. In one embodiment, the constant output current value of curve 703 in FIG. 7, is determined by the current limit of power switch 513 at the regulation current threshold, the turns ratio of the transformer of energy transfer element 645, and the inductance of primary winding 661. It is appreciated that it is possible to select any combination of output voltage and constant current value within the power range of power supply regulator 621 by selecting an appropriate primary inductance and turns ratio for the transformer of energy transfer element 645 and the value of resistor 639.

Thus, in one embodiment, constant output voltage/constant output current characteristics are provided by power supply 601 through sensing of the reflected voltage V1 657. In the embodiments illustrated, flyback converter power supplies have been provided for explanations of the present invention. It is appreciated that other power supply configurations such as for example non-isolated buck converter power supplies using for example inductors for energy transfer elements may also be utilized in accordance with the teachings of the present invention. Since the inductor used in the non-isolated buck converter has only one winding which is coupled to both input and output, the equivalent turns ratio is equal to 1 and the reflected voltage is the same as the output voltage.

In one embodiment of a power supply employing the switching regulator block diagram such as for example that shown in FIG. 5, the trims on pins T1, T2, T3 and T4 can be used to trim either the switching frequency or the regulation current threshold current (of the current sensor 521) of the power supply regulator or the current limit (of the power switch 513) of the power supply regulator 505, to influence the power supply output characteristic.

The regulated value of $V_{OUT}$ at DC output 655 can therefore be adjusted by using one or more of the trim terminals (T1, T2, T3 and T4) to adjust the regulation current threshold of a current $I_C$ flowing into control input terminal 625. The threshold can be raised (increasing regulation current threshold of current $I_C$ and therefore $V_{OUT}$) or lowered (reducing regulation current threshold of current $I_C$ and therefore $V_{OUT}$) using the trim terminals T1, T2, T3 and T4.

In one embodiment, the power supply 601 shown in FIG. 6 can operate in either the discontinuous or continuous mode. In the discontinuous mode of operation, the maximum output power of the power supply 601 is governed by the following equation:

$$\text{Output Power Max} = \tfrac{1}{2} L \cdot I_{PK}^2 \cdot f \cdot \eta \qquad \text{Equation 1}$$

where L is the primary inductance of the energy transfer element 645 of FIG. 6, $I_{PK}$ is the peak primary current limit of power supply regulator 621, f is the power supply regulator 621 operating frequency and $\eta$ is the efficiency of power supply 601

In addition, $$\text{Output Power Max} = V_{OUT} \cdot I_{OUTMAX} \qquad \text{Equation 2}$$

where $V_{OUT}$ is the power supply DC output voltage and $I_{OUTMAX}$ is the maximum power supply DC output current.

Accordingly, combining Equations 1 and 2, $$V_{OUT} \cdot I_{OUTMAX} = \tfrac{1}{2} L \cdot I_{PK}^2 \cdot f \eta \qquad \text{Equation 3}$$

It follows from Equation 3 that if $V_{OUT}$ is regulated by the power supply regulator as described above such that $V_{OUT}$ is substantially constant, then varying either the current limit or operating frequency of the power supply regulator will adjust the maximum DC output current of the power supply. These aspects of one embodiment of the present invention are illustrated in FIG. 7

The output characteristic of the power supply can therefore be adjusted by trimming: (1) regulation current threshold of $I_C$—to adjust $V_{OUT}$, and (2) either the power supply regulator current limit or the operating frequency to adjust $I_{OUT}$.

In one embodiment, if the power supply is designed to operate in the continuous mode of operation at peak power output, the same variables can be trimmed though the relations of Equations 1 and 3 in accordance with known techniques.

By applying the trims as discussed above, the output characteristic can be adjusted as shown in FIG. 7. In one embodiment, trim terminals T1, T2 and T3 are used to adjust the operating frequency of the power supply regulator with weightings of approximately 4, 8 and 16% respectively, which controls the output peak power of the power supply. In one embodiment, trim terminal T4 is used to trim the $I_C$ regulation current threshold of the power supply regulator by approximately 7.5%, which controls the output voltage of the power supply.

In the foregoing detailed description, the method and apparatus of the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus, comprising:
   a printed circuit board including one or more removable portions;

an electrical circuit completely assembled onto the printed circuit board, wherein the electrical circuit includes a power supply switching regulator electrical circuit, the electrical circuit including one or more electrical connections coupled to one or more components on the printed circuit board, said one or more removable portions of the printed circuit board having said one or more electrical connections disposed thereon, said one or more removable portions of the printed circuit board to be removed after the electrical circuit is completely assembled to break respective said one or more electrical connections to adjust an electrical parameter of the power supply switching regulator electrical circuit after the electrical circuit is completely assembled.

2. The apparatus of claim 1 further comprising one or more slots at locations on the printed circuit board where said one or more or more electrical connections are broken after said one more removable portions of the printed circuit board are removed.

3. The apparatus of claim 1 further comprising one or more holes defined at locations on the printed circuit where said one or more or more electrical connections are broken after said one more removable portions of the printed circuit are removed.

4. The apparatus of claim 1 wherein said one or more removable portions of the printed circuit board are adapted to be broken off from the printed circuit board to break said respective one or more electrical connections.

5. The apparatus of claim 1 wherein said one or more electrical connections comprise metal traces coupled to one or more components on the printed circuit board.

6. The apparatus of claim 1 wherein the electrical circuit comprises frequency adjustment circuitry responsive to broken said one or more electrical connections.

7. The apparatus of claim 1 wherein the electrical circuit comprises switching frequency adjustment circuitry responsive to broken said one or more electrical connections.

8. The apparatus of claim 1 wherein the electrical circuit comprises current limit adjustment circuitry responsive to broken said one or more electrical connections.

9. The apparatus of claim 1 wherein the electrical circuit comprises current limit adjustment circuitry responsive to broken said one or more electrical connections to adjust a current limit of a power switch included in the switched mode power supply circuitry.

10. The apparatus of claim 1 wherein the electrical circuit comprises regulation current threshold adjustment circuitry responsive to broken said one or more electrical connections.

11. The apparatus of claim 1 wherein the electrical circuit comprises regulation current threshold adjustment circuitry responsive to broken said one or more electrical connections to adjust a regulation current threshold that controls a voltage output of the switched more power supply circuitry.

12. The apparatus of claim 1 wherein the electrical circuit comprises regulation current threshold adjustment circuitry responsive to broken said one or more electrical connections to adjust a regulation current threshold that determines an onset of a duty cycle control of the switched mode power supply circuitry.

13. The apparatus of claim 1 wherein the electrical circuit comprises output voltage adjustment circuitry responsive to broken said one or more electrical connections to adjust an output voltage of the switched mode power supply circuitry.

14. The apparatus of claim 1 wherein the electrical circuit comprises output characteristic adjustment circuitry responsive to broken said one or more electrical connections to adjust an output characteristic of the switched mode power supply circuitry.

* * * * *